(12) United States Patent
Becker

(10) Patent No.: US 6,550,047 B1
(45) Date of Patent: *Apr. 15, 2003

(54) SEMICONDUCTOR CHIP INPUT/OUTPUT CELL DESIGN AND AUTOMATED GENERATION METHODS

(75) Inventor: Scott T. Becker, San Jose, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 09/679,059

(22) Filed: Oct. 2, 2000

(51) Int. Cl.⁷ .............................. G06F 17/50; G06F 9/45

(52) U.S. Cl. ...................... 716/8; 716/2; 716/9; 716/10

(58) Field of Search ............................... 716/8, 9, 10, 2

(56) References Cited

U.S. PATENT DOCUMENTS

| | | | | |
|---|---|---|---|---|
| 4,825,107 A | * | 4/1989 | Naganuma et al. | 326/47 |
| 4,947,233 A | * | 8/1990 | Aso | 257/203 |
| 4,988,636 A | * | 1/1991 | Masleid et al. | 438/129 |
| 5,045,913 A | * | 9/1991 | Masleid et al. | 257/409 |
| 5,063,429 A | * | 11/1991 | Crafts | 257/203 |
| 5,239,465 A | * | 8/1993 | Hattori et al. | 716/8 |
| 5,404,033 A | * | 4/1995 | Wong et al. | 257/202 |
| 5,552,333 A | * | 9/1996 | Cheung et al. | 438/129 |
| 5,633,807 A | * | 5/1997 | Fishburn et al. | 716/19 |
| 5,654,898 A | * | 8/1997 | Roetcisoender et al. | 716/9 |
| 5,737,236 A | | 4/1998 | Maziasz et al. | 364/490 |
| 5,764,533 A | * | 6/1998 | deDood | 716/8 |
| 5,946,477 A | * | 8/1999 | Ito | 716/9 |
| 5,987,086 A | * | 11/1999 | Raman et al. | 716/1 |
| 6,013,924 A | * | 1/2000 | Osajima et al. | 257/203 |
| 6,057,169 A | * | 5/2000 | Singh et al. | 438/14 |
| 6,127,208 A | * | 10/2000 | Amiya et al. | 438/129 |
| 6,385,761 B1 | * | 5/2002 | Breid | 716/8 |
| 6,446,250 B1 | * | 9/2002 | Becker | 716/17 |

OTHER PUBLICATIONS

LSI Logic, Package Planner: Isipackage, User's Guide, Version 2.0.2, pp. 1–70, Jun. 2001.*

B.A. Richman et al., A Deterministic Algorithm for Automatic CMOS Transistor Sizing, IEEE Journal of Solid State Circuits, pp. 522–526, Apr. 1998.*

L.Y. Lu et al., An Automated, Structured Layout Methodology for Staggered Pad, I/O Bound ASIC Design, pp. P11/6.1–P11/6.4, Sep. 1990.*

(List continued on next page.)

Primary Examiner—Vuthe Siek
Assistant Examiner—A. M. Thompson
(74) Attorney, Agent, or Firm—Martine & Penilla, LLP

(57) ABSTRACT

An automated method for generating input/output (I/O) cells for an integrated circuit chip is provided. The method includes receiving a width parameter (as user requested data) for a desired I/O cell to be used for the integrated circuit chip. The method also includes receiving a tolerance parameter for the desired I/O cell. A cell library is selected to have a plurality of slices to meet the tolerance parameter. Then, the method proceeds to determine a number of the plurality of slices to be used to fit within the width parameter and to satisfy a drive strength parameter. The width parameter is then filled with a first row of the determined number of the plurality of slices. If the first row of slices (in either the N-channel device region or the P-channel device region) does not meet the drive strength parameter, additional rows (e.g., of dynamically adjusted height) can be added to provide an additional amount of transistor width that will meet the drive strength requirement. The generation of the I/O cells also includes the auto generation of P-tap regions, N-tap regions, isolation ring regions, and a receiver pre-driver region. The automated method is preferably provided as an I/O generation software tool to enable circuit designers with the flexibility of quickly generating I/O cells that meet each of their physical layout requirements as well as their performance demands.

25 Claims, 11 Drawing Sheets

OTHER PUBLICATIONS

D. Schweikert, A 2-Dimensional Placement Algorithm for the Layout of Electrical Circuits, Proceedings of the 13$^{th}$ Design Automation Conference on Design Automation, pp. 408–416, 1976.*

Hörbst et al., "*Venus—Entwurf von VLSI—Schaltungen*", 1986, XP002199494, p. 185, para. 7, Springer–Verlag, Berlin, Germany.

Guruswamy et al., "*Cellerity: A Fully Automatic Layout Synthesis System for Standard Cell Libraries*", Design Automation Conf., Jun. 1997, XP010227603, pp. 327–332, vol. 34, ISBN: 0–7803–4093–0, NY.

Haddad et al., "*Discrete Drive Selection for Continuous Sizing*", Oct. 1997 IEEE Int'l. Conf., Austin TX, XP010251724, pp. 110–115, ISBN: 0–8186–8206–X, Alamitos, CA.

Saika et al., "*A Two-dimensional Transistor Placement for Cell Synthesis*", Jan. 28, 1997, Design Automation Conf., pp. 557–562, XP010231615, ISBN: 0–7803–3662–3, NY, US, IEEE.

Chen et al., "*Performance Driven Cell Generator for Dynamic CMOS Circuits*", Int'l Symposium on Circuits and Systems, Portland, May 1989, vol. 3 Symp. 22, pp. 1883–1886, XP000131424, NY, IEEE, US.

* cited by examiner

SEMICONDUCTOR CHIP INPUT/OUTPUT CELL DESIGN AND AUTOMATED GENERATION METHODS

BACKGROUND OF THE INVENTION

1. Field of the Invention

The present invention relates generally to integrated circuits, and more particularly to the automated generation of input/output (I/O) cells for use in semiconductor integrated chips.

2. Description of the Related Art

In the design of semiconductor integrated circuits, circuit designers commonly utilize what are known as "standard cells" to achieve a particular circuit response. Standard cells are essentially pre-designed layouts of transistors that are wired to perform a certain type of logical function. By way of example, a company, such as Artisan Components, Inc. of Sunnyvale, Calif., designs standard cell libraries incorporating many different types of standard cells, each for performing a specific type of logical operation or operations. The standard cells of the standard cell library are then used by integrated circuit design engineers in conjunction with modeling software to produce a larger scale circuit design that meets a particular specification.

A basic component of designing an integrated circuit of a semiconductor chip is the design of input/output (I/O) cells. As is well known, semiconductor chips have a core region that is defined in a center portion of a chip and I/O cells that are defined around the core region. I/O pads are then defined along the periphery of the chip surrounding the I/O cells. Conventionally, the I/O pads are selected to follow a defined pad pitch (i.e., spacing between pads). The I/O pads are electrically interconnected to selected I/O cells, which in turn provide access to and from the core region. The I/O cells, as is well known, are designed and selected to meet certain minimum performance characteristic. This is required since particular I/O cells are required to, for example, buffer and condition signals in and out of the core region, provide minimum levels of electrostatic discharge (ESD) protection, and have transistors that can withstand selected voltage tolerances.

Beyond meeting performance characteristics, there is a general desire to have the I/O cells fit in an optimized manner around a given core region. Unless custom designed, pre-designed I/O cells are generally provided as part of a cell library. Cell libraries, as is well known, provide design engineers with a number of choices in cell sizes. One example is I/O cells being 45 microns wide and having its associated. I/O pads arranged in a staggered arrangement. Another example is an I/O cell having a width of 80 microns and its associated I/O cells arranged in an in-line manner. Because I/O cells are required to provide certain performance characteristics, narrower cells, such as the 45 micron cell width, are taller relative to the 80 micron cell width. Therefore, no matter what the selected width may be, the height will have to be adjusted accordingly (either taller or shorter) to ensure that the same amount of transistor area is provided to meet the performance requirement.

Although some optimization is provided by the use of library pre-designed I/O cells and associated I/O pads, a library will generally only provide a few I/O cell options. Thus, a designer will have to select one type of I/O cell option in order to prevent the introduction of white space in the core region of the chip. As defined herein, "white space" is area in the chip in which no devices are formed. That is, the core region of a chip will generally be defined to some arbitrary size depending upon the use and function of the chip being designed. Once the core region is defined, the chip designer will try to optimize the I/O cells (which are defined as a ring around the core region) such that little or no white space is left in the core region. Because the core region can have any size depending upon the application, it is generally very difficult or nearly impossible to match up the ring of I/O cells in a manner that leaves no white space in the core region.

Even though white space may not impact the performance of a chip, the fact that white space is introduced forces the physical size of a silicon chip to be larger that needed. As a result, more expensive wafer space is needed to make the desired chip. This increased cost will generally drive up the cost of the end-product implementation and thus the cost to the consumer. As mentioned above, the I/O cells can be manually designed for each application to provide a better match to a given core region, however, manual design also drives up the cost of the end product since more engineering time is needed to perform the customization.

In view of the foregoing, there is a need for automated I/O generation techniques to enable designers to quickly design I/O cells and I/O pads in a manner that produces good optimization between a chip's I/O region and the chip's core region.

SUMMARY OF THE INVENTION

Broadly speaking, the present invention fills these needs by providing an automated method for generating I/O cells and associated pads for an integrated circuit. It should be appreciated that the present invention can be implemented in numerous ways, including as a process, an apparatus, a system, a computer readable media, a device, or a method. Several embodiments of the present invention are described below.

In one embodiment, an automated method for generating input/output (I/O) cells for an integrated circuit chip is disclosed. The method includes receiving a width parameter for a desired I/O cell to be used for the integrated circuit chip and then receiving a tolerance parameter for the desired I/O cell. The method then moves to select a cell library having a plurality of slices of equal width. The cell library is selected to meet the tolerance parameter.

Then, the method proceeds to determine a number of the plurality of slices to fit within the width parameter and to satisfy a drive strength parameter. The width parameter is then filled with a first row (or additional stacked rows if needed) of the determined number of the plurality of slices.

In another embodiment, a computer implemented method for automatically generating a custom I/O cell for an I/O region of a semiconductor chip is disclosed. The I/O ring is defined around a core region of the semiconductor chip. The computer implemented method includes providing a selection form (or any computer interface such as a GUI) requesting user input of a desired I/O cell width and performance characteristics. The method then moves to receiving user input from the selection form. A cell slice width for cell slices to be obtained from a cell slice library is selected. The method then proceeds to determine a transistor width requirement to meet the performance requirements and determine a height for the custom I/O cell. The height is selected so as to meet the transistor width requirement while maintaining the desired I/O cell width. The method then moves to filling the desired I/O cell width with one or more of the cell slices having the determined height. The custom I/O cell is configured to at least meet the performance requirements.

In still another embodiment, a method for generating an I/O cell and an associated bond pad is disclosed: The I/O cell and the bond pad are designed to be replicated around a core region of an integrated circuit chip. The method includes receiving a pad pitch parameter and user defined performance characteristics. The performance characteristics include a drive strength parameter. Then, the method moves to receiving a selection of one of an in-line pad arrangement and a staggered pad arrangement. The method then generates an I/O cell having the I/O cell width and a configured height, the configured height is defined to meet the performance characteristics.

In another embodiment, a computer readable media containing program instructions for generating input/output (I/O) cells for an integrated circuit chip is disclosed. The computer readable media includes: (a) program instructions for receiving a width parameter for a desired I/O cell to be used for the integrated circuit chip; (b) program instructions for receive a tolerance parameter for the desired I/O cell; (c) program instructions for selecting a cell library having a plurality of slices of equal width, the selection being configured to select cells meeting the tolerance parameter; (d) program instructions for determining a number of the plurality of slices to be used to fit within the width parameter and to satisfy a drive strength parameter; and (e) program instructions for filling the width parameter with a first row (or additional rows if needed to meet the drive strength parameter) of the determined number of the plurality of slices. The advantages of the present invention are numerous. Most notably, the embodiments of the present invention eliminate the need for circuit library designers to design thousands upon thousands of pre-designed I/O cell designs. In the past, these pre-designed I/O cell designs (although far from complete) were designed in an attempt to provide customers of cell libraries enough choices from which to select a desired I/O cell size and performance characteristic. The automated I/O cell generation software defined herein is thus designed to eliminate the need to produce thousands of pre-designed I/O cells for a given I/O library offering. In accordance with the embodiments of the invention, the designer implementing cells from the library can now generate his or her own I/O cells and associated pad layouts that meet physical size requirements and performance requirements. The desires of the design engineer are thus simply provided to the I/O generation software for the custom generation of I/O cells meeting the designer's requirements. If a modification is desired, the I/O cells can simply and quickly be regenerated to meet the designers' new modifications.

These and other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for an automated technique for generating input/output (I/O) cells for an integrated circuit chip is disclosed. The I/O cells are preferably generated to meet desired requested physical characteristics as well as performance characteristics. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
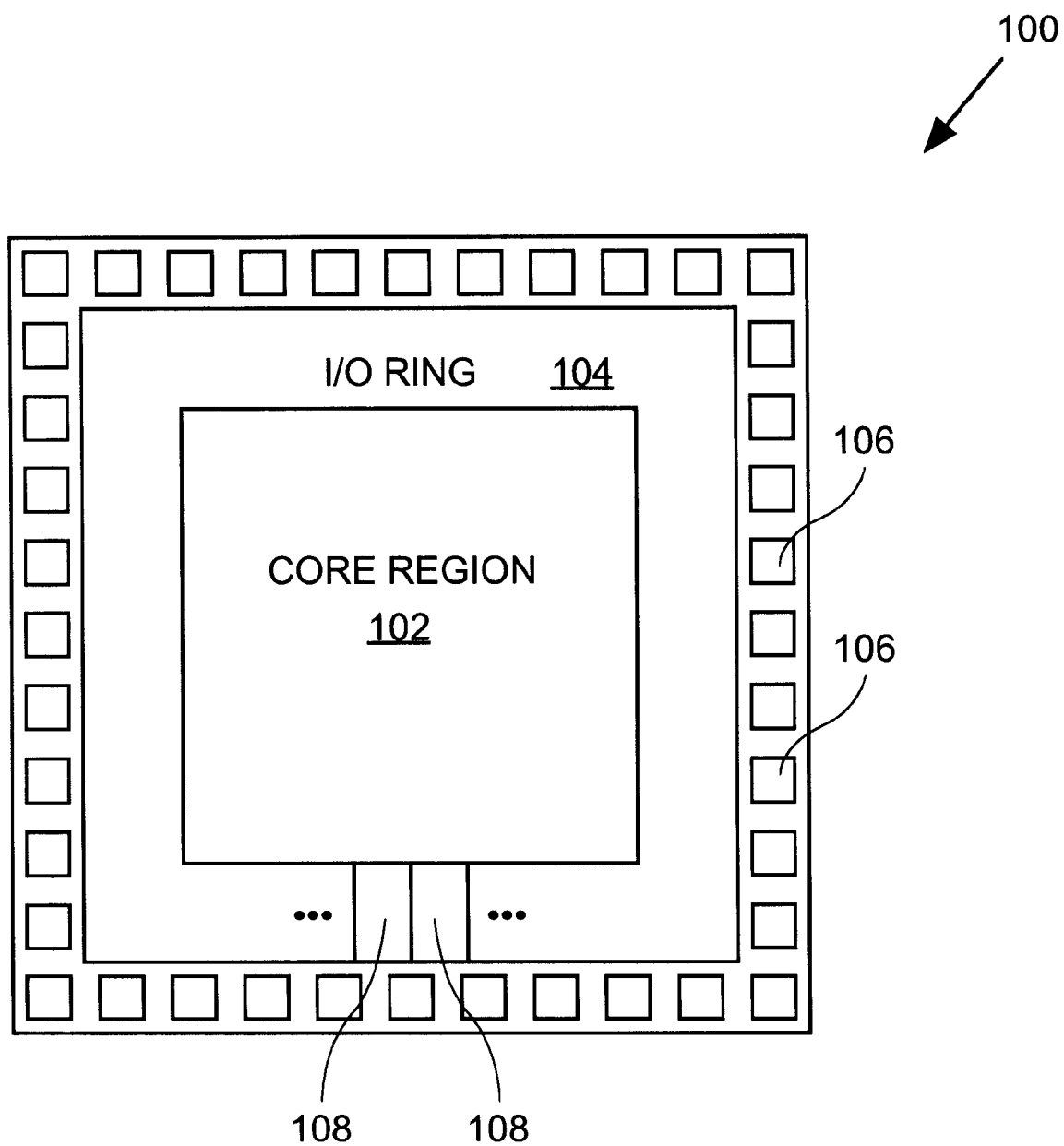
FIG. 1A shows a semiconductor chip having a core region and an input/output (I/O) ring, in accordance with one embodiment of the present invention.

FIG. 1A shows a semiconductor chip 100 having a core region 102 and an input/output (I/O) ring 104, in accordance with one embodiment of the present invention. The I/O ring 104 includes a plurality of I/O cells 108 that are arranged around the periphery of the core region 102. Arranged around the I/O ring 104 are a plurality of I/O pads 106. In accordance with one embodiment of the present invention, an automated technique for generating the I/O cells 108 is provided. The automated technique is configured to generate I/O cells 108 that will meet the desired size requirements in terms of associated pad 106 pitch, and performance. The generated I/O cells can thus be quickly and inexpensively generated to be used for any size core region 102 of a chip. If the generated I/O cells are not to the designer's liking, the I/O cells can easily be regenerated after modifications to the design parameters (e.g., by way of a design user interface display) is performed.

Figure 1B:
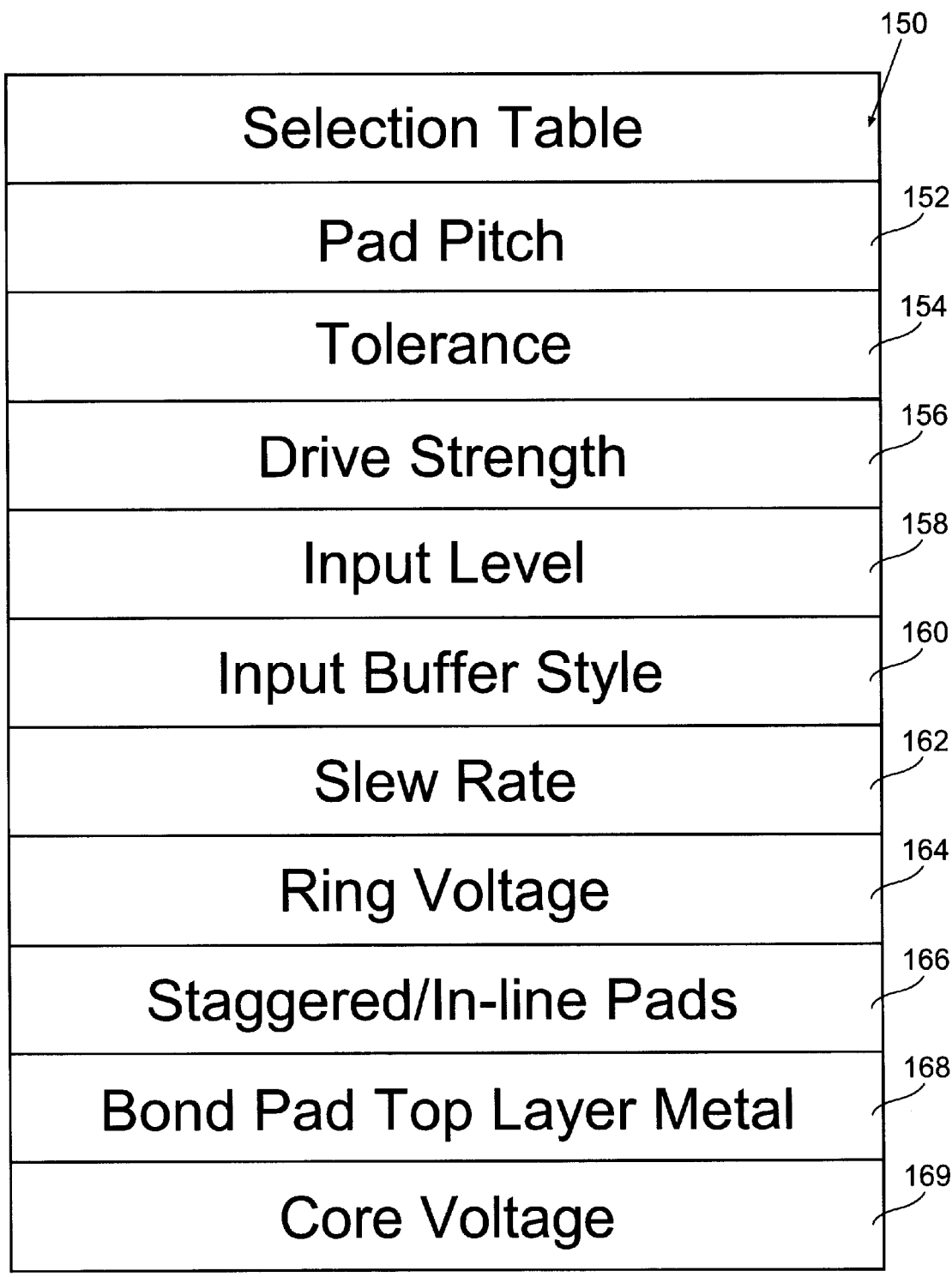
FIG. 1B illustrates a selection table having parameters that may be used to design an I/O cell.

The automated generations techniques are designed to take into account desired performance characteristics that will determine the amount of transistor width required within the I/O cells 108 in order to perform the desired functions. For instance, FIG. 1B provides a selection table 150 that includes a plurality of variables that are configured to determine the size of the I/O cell 108 for a particular design. In general, a user (typically a design engineer) will be provided with a selection table 150 (e.g., which can be a text or graphical display having any layout) which prompts the user to provide information regarding each of the desired characteristics. In some cases, some of the parameters may be default values that can be changed by the user, and other parameters can be input as unique values for the particular design. As shown, the selection table 150 includes a pad pitch parameter 152, a tolerance parameter 154, a drive strength parameter 156, an input level parameter 158, an input buffer style parameter 160, a slew rate parameter 162, a ring voltage parameter 164, a staggered or inline pad arrangement parameter 166, a bond pad top layer metal parameter 168, and a core voltage parameter 169. It should be noted that these identified parameters do not represent an exhaustive list, but each is merely provided as an example.

Initially, the user may provide a desired I/O cell 108 width for a given design. The width is initially selected by the user such that the width allows optimized layout relative to the core region 102. Once the I/O cell. 108 width is provided by the user, an associated pad pitch parameter 152 will, in one embodiment, be the same since each pad is associated with a given I/O cell 108. Upon determining the I/O cell 108 width, a drive strength parameter 156 is ascertained to enable a determination of the amount of transistor width required to provide the desired drive strength parameter 156. In one example, the drive strength may be provided in the form of a milli-Amp unit or in terms of Ohms. In general, the expression of "drive strength" can be in any manner so long as it is possible to ascertain the proper amount of transistor width to be designed into the I/O cell 108. Other factors, as shown in the selection table 150, include the determination of a particular slew rate parameter 162. The slew rate parameter can be selected such that the device is a quieter, yet slower device, or a noisier device having faster speed capabilities. The input buffer style parameter 160, in one embodiment, can be selected to be a Schmitt design or a non-Schmitt design. The input level parameter 158 can be designed to determine whether the input level should be CMOS or LVTTL. The tolerance parameter 154 is generally designed to be one or two steps above a ring voltage, and the ring voltage parameter 164 can be designed to have any desired value. Exemplary ring voltage values may be 1.8 volts, 2.5 volts, 3.3 volts, and 5 volts. The staggered pad arrangement is generally designed to have the bond pads aligned along the outer periphery of the semiconductor chip such that each alternating bond pad is slightly offset and staggered relative to one another. The staggered arrangement provides for the design of narrower I/O cells 108 around the periphery of the semiconductor chip. In-line pad arrangements are generally defined as shown in FIG. 1A, wherein the I/O pads 106 are aligned along the periphery of the semiconductor chip 100. The bond pad top layer metal 168 parameter is designed to define which metal layer will be the top metal layer for a particular semiconductor chip. This determination will set the process parameters required to fabricate the set metal level bond pad.

Figure 2A:
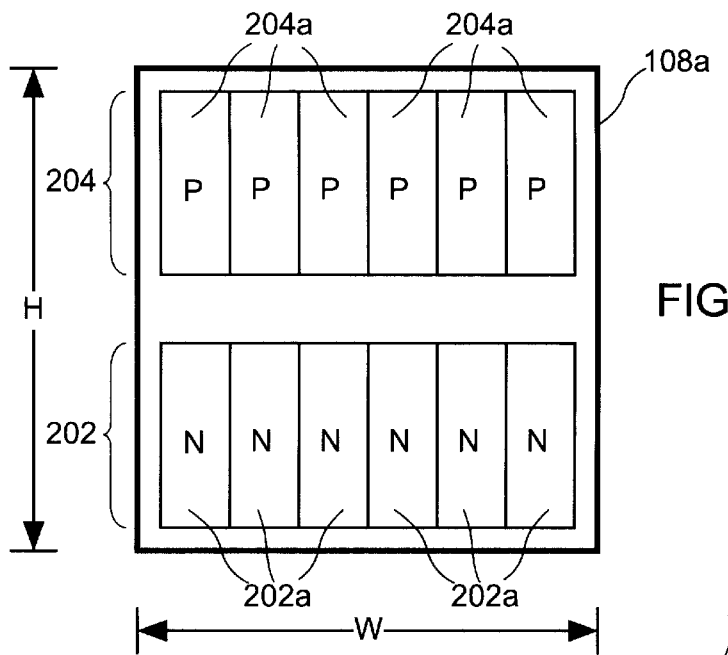
FIG. 2A shows one example of a generated I/O cell, in accordance with one embodiment of the present invention.

FIG. 2A shows one example of a generated I/O cell 108a, in accordance with one embodiment of the present invention; The generated I/O cell 108a is divided in two parts. A first part defines N-type transistor cell slices 202, and the second part that is defined by P-type transistor cell slices 204. As shown, the N-type transistor cell slices 202 will include a: plurality of N-type cell slices 202a. The P-type transistor cell slices 204 will include a plurality of P-type cell slices 204a. As will be discussed below in greater detail, the width of the generated I/O cell 108a can be pre-selected by a user depending on the particular design being fabricated.

In this example, once the width of the generated I/O cell 108a has been determined, a cell slice family is selected for implementing the generated I/O cell 108a. The cell slice family will include a plurality of cell slices having a fixed width and a particular tolerance. The tolerance, as is well known, defines the amount of gate stress that a transistor in the given family can handle. In addition, each of the N-type cell slices 202a and the P-type cell slices 204ahave a common width. By determining the width of each of these cell slices, it can be determined how many cell slices 202a and 204awill fit within the desired I/O cell width 108a. In circumstances where the fixed cell slice does not equally fit within the desired generated I/O cell 108, edge cells in cell 108a are extended such that the I/O cell will meet the desired width requirement.

Figure 2B:
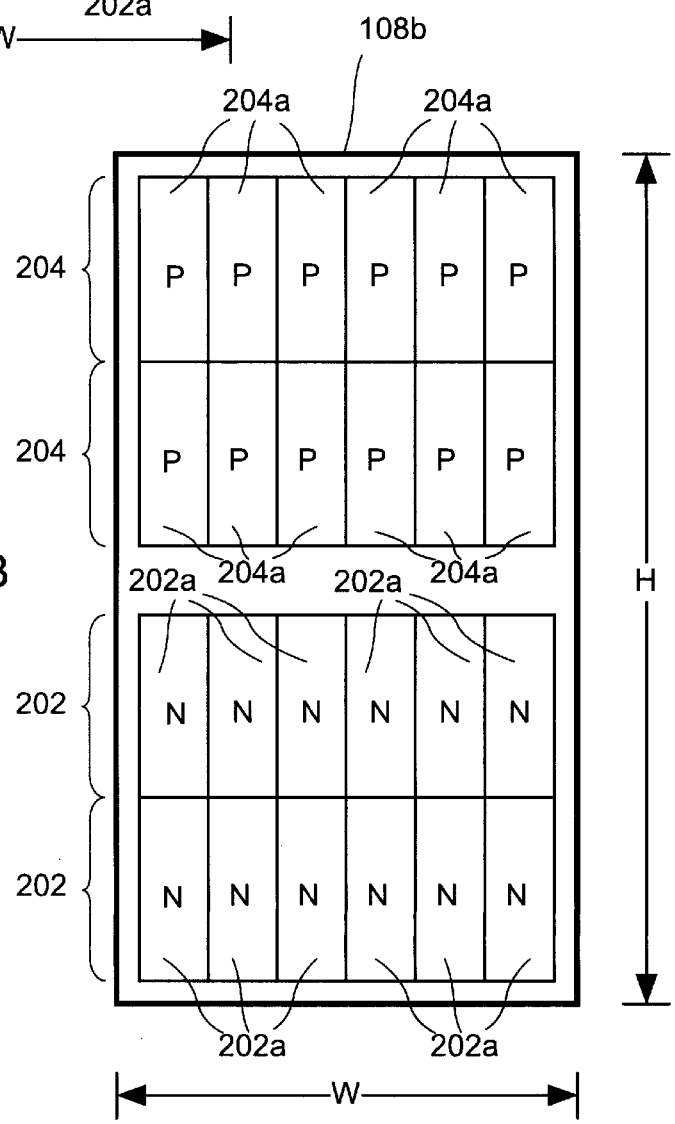
FIG. 2B illustrates a case in which additional cell slices were automatically distributed over the first row of cell slices in order to provide the desired drive strength for the design, in accordance with one embodiment of the present invention.
Figure 2C:
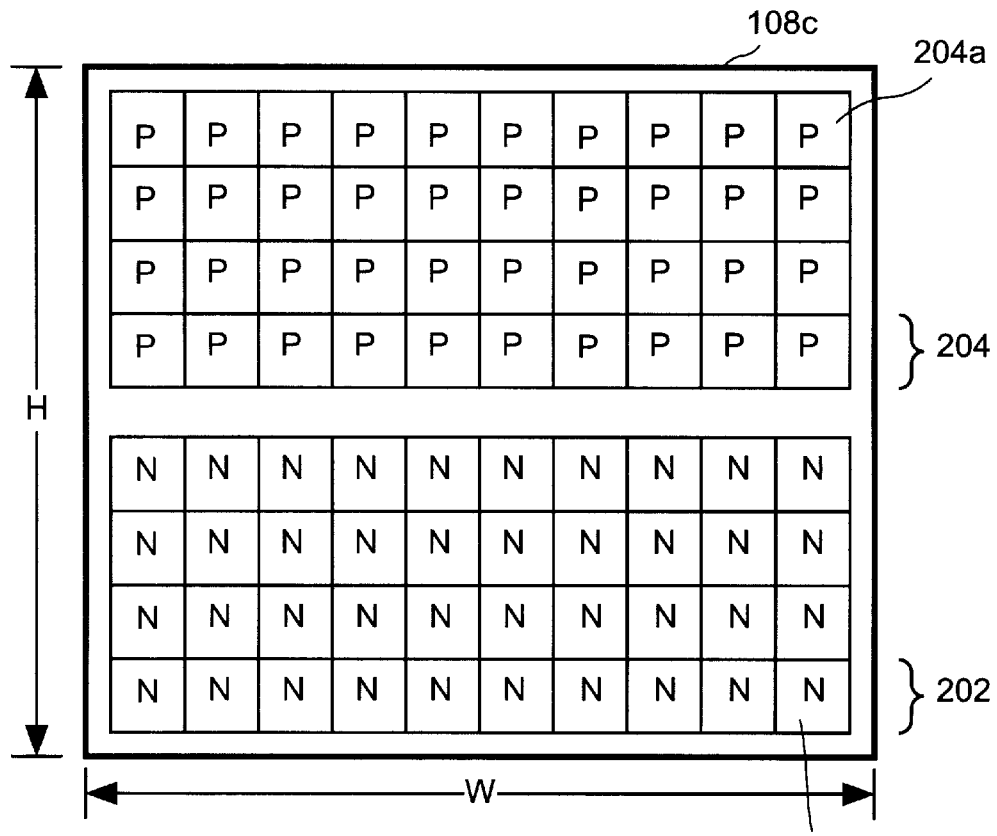
FIGS. 2C–2F illustrates additional embodiments for generating I/O cell, in accordance with one embodiment of the present invention.

However, if the number of cell slices is slightly larger than that of the desired width, the last cell slice or slices will be re-generated and applied to a second level (or additional levels if need as shown in FIG. 2C) of cell slices as shown in FIG. 2B. For example, if a user desires to have a 16 milli-Amp drive strength for a particular design, and 6 cell slices only provides 8 milli-Amps of drive strength, there will be a need for a second row of cell slices arranged over the first row of cell slices. In this manner, additional transistor width is provided by the additional cell slices. In a preferred embodiment, each cell slice may have two transistors, or four transistors, depending upon the size of the cell slice. Each of the transistors in each of the cell slices can then be interconnected to provide the proper functionality as dictated by the particular design. For example, the design may require a set drive strength, an input resistance of a certain size, ESD protection of a given strength, etc. Therefore, FIG. 2B illustrates a case in which additional cell slices were automatically distributed over the first row of cell slices in order to provide the desired drive strength for the design. Thus, the generated I/O cell 108b will have a larger height than the generated I/O cell 108a. However, the desired width will remain the same so that the desired pad pitch and pad arrangement style can be maintained.

Figure 2D:
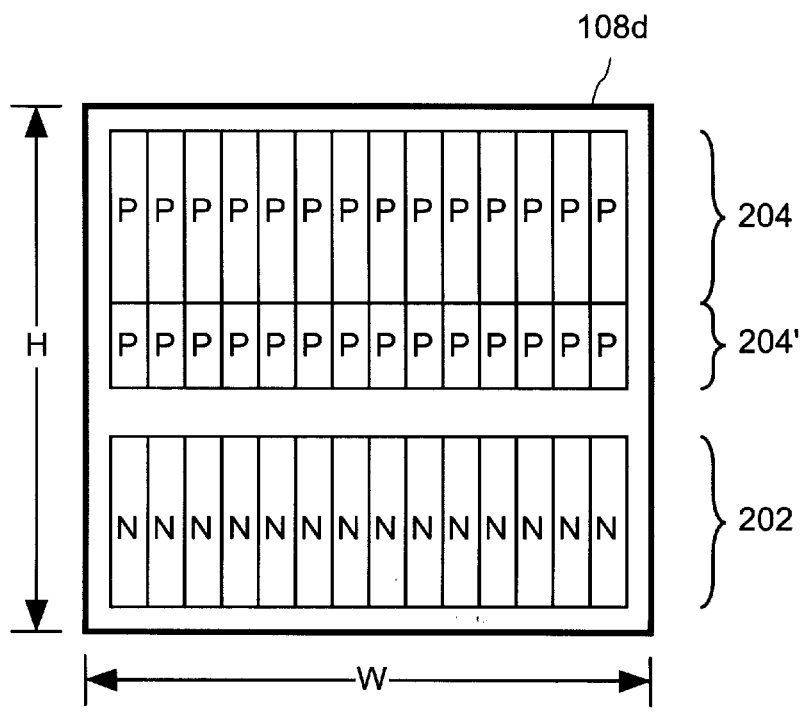

FIG. 2C illustrates yet another embodiment of a generated I/O cell 108c. In this embodiment, the cell slice library provides N-type cell slices 202a and P-type cell slices 204a which are relatively short in height and thus provide the ability to generate the desired transistor width for each of the N-type transistor cell slices 202, and the P-type transistor cell slices 204. In this example, once the user selected a desired width for the generated I/O cell 108c, the performance characteristics will dictate the number of cell slices 202a and 204athat will be needed to complete the desired design. FIG. 2D shows yet another embodiment in which the P-type cell slices 204 added a second row of P-type slices 204'. However, the N-type region of N-type slices 202 did not require for this particular application, additional transistor width. Accordingly, FIG. 2D is provided to illustrate that the number of transistors or transistor width provided by each of the slices in each of the N-type regions and P-type regions do not necessarily have to be equal, and will be generated based upon the performance characteristics desired by the user.

Figure 2E:
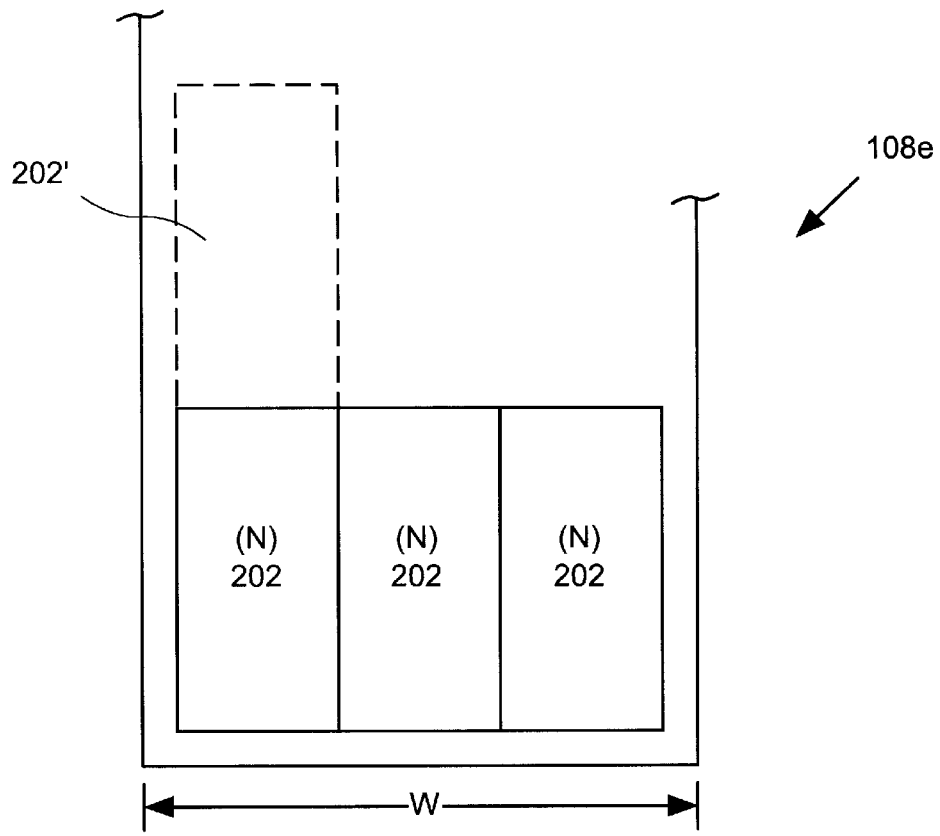
Figure 2F:
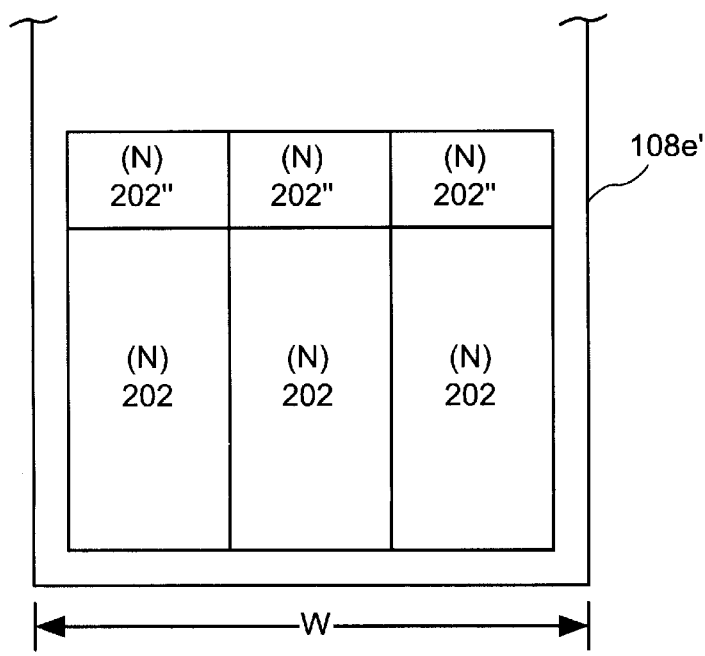

FIG. 2E illustrates a partially generated I/O cell 108e, in accordance with one embodiment of the present invention. To illustrate the automated generation of the I/O cell, a fixed width is first selected by the user and a particular cell width that is optimum to the selected width of the I/O cell is obtained by selecting a cell slice family having a particular tolerance. Each cell slice in the cell slice family will have a fixed width and that width will be used to define each of the cell slices to be used to build the generated I/O cell 108e' as shown in FIG. 2F. In FIG. 2E, the desired drive strength requirements may dictate that four cell slices 202 be provided to ensure that the proper amount of transistor width is designed into the N-type region of the generated I/O cell 108e'.

However, cell slice 202' is the only additional cell slice needed to provide the desired drive strength and cell slice 202' will not fit inside of the user-defined cell width. In order to maintain the same width for the generated I/O cell 108e', the cell slice 202' is automatically divided into the proper number of sub-cell slices to fill the desired width of the I/O cell 108e'. Thus, an auto adjustment of the cell slice 238' height is performed such that three cell slices 238" (in this example) are arranged in place of the one cell slice 238' of FIG. 2E.

Figure 3:
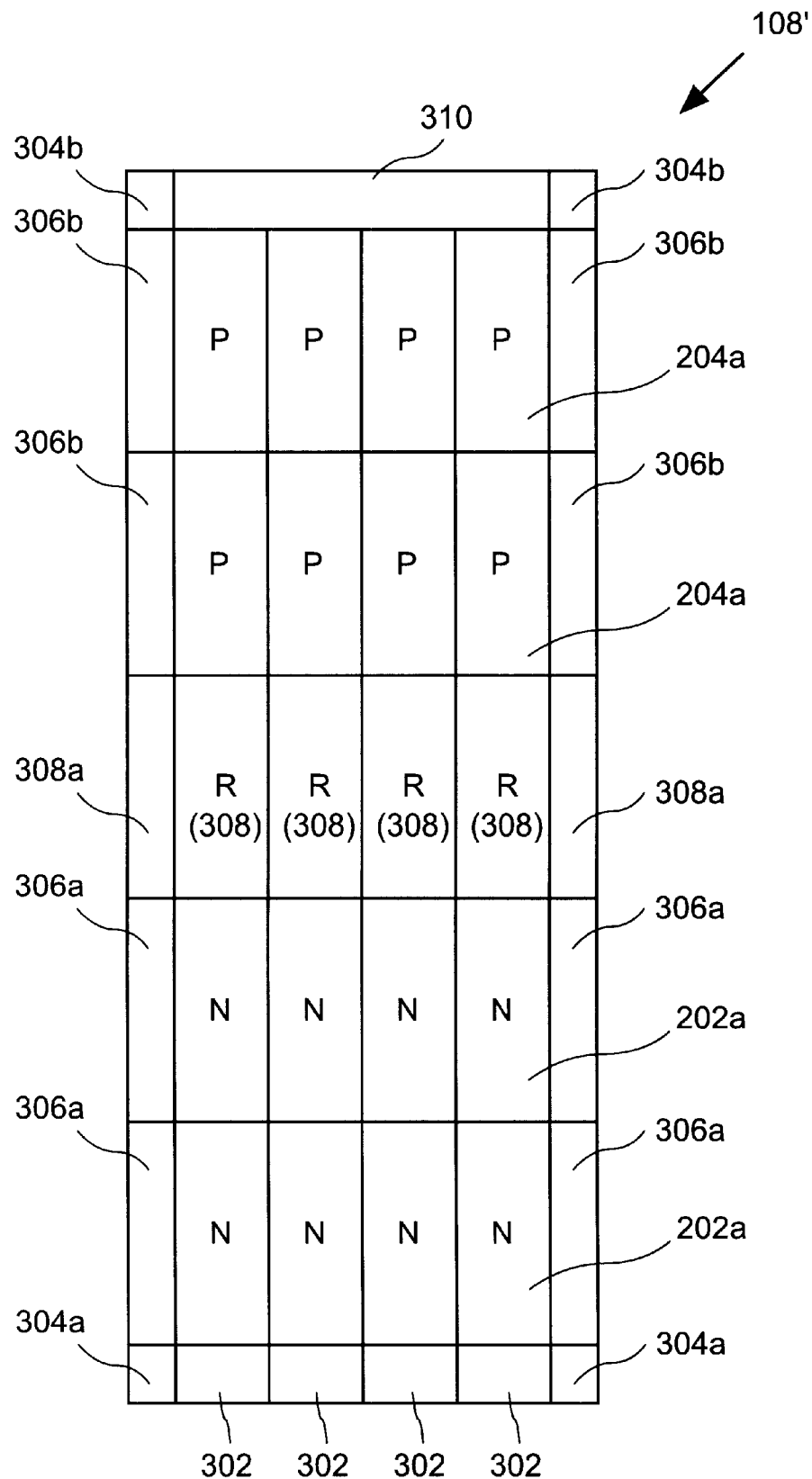
FIG. 3 shows a more detailed diagram of a generated I/O cell, in accordance with one embodiment of the present invention.

FIG. 3 shows a more detailed diagram of a generated I/O cell 108', in accordance with one embodiment of the present invention. As described above, the generated I/O cell 108' includes N-type cell slices 202a and P-type transistor cell slices 204a. In addition to the N-type and P-type transistors, each generated I/O cell will also require proper isolation to ensure optimal performance once integrated into the chip design. In this embodiment, the N-type transistor cell slices 202 are surrounded by P-tap guard ring slices 306a, P-tap guard ring comners 304a, and P-tap guard ring slices 302.

The N-type transistors are also separated and isolated from the P-type transistors by a ring region 308. Ring region 308 includes, in this example, four ring slices 308, and a pair of guard ring slices 308a. As was the case for the N-type transistors, the P-type transistors are also surrounded by N-tap guard ring slices 306b. At the topmost portion of the generated I/O cell 138 ' is a receiver pre-driver slice 310. A receiver pre-driver slice 310 is generally a short slice in height. The guard ring cells 304b, 306b, 308a, 306a and 304a can be used to extend the width of the cell if the transistor slices do not fit optimally in the user selected width. In an alternative embodiment, the receiver pre-driver slice 310 can be provided in the form of a plurality of slices having the same width as each of the cell slices for the P-type transistors, the N-type transistors, and the ring slices 308. Finally, it should be noted that the receiver pre-driver slice 310 will thus abut the core region 102 of the semiconductor chip 100.

Figure 4:
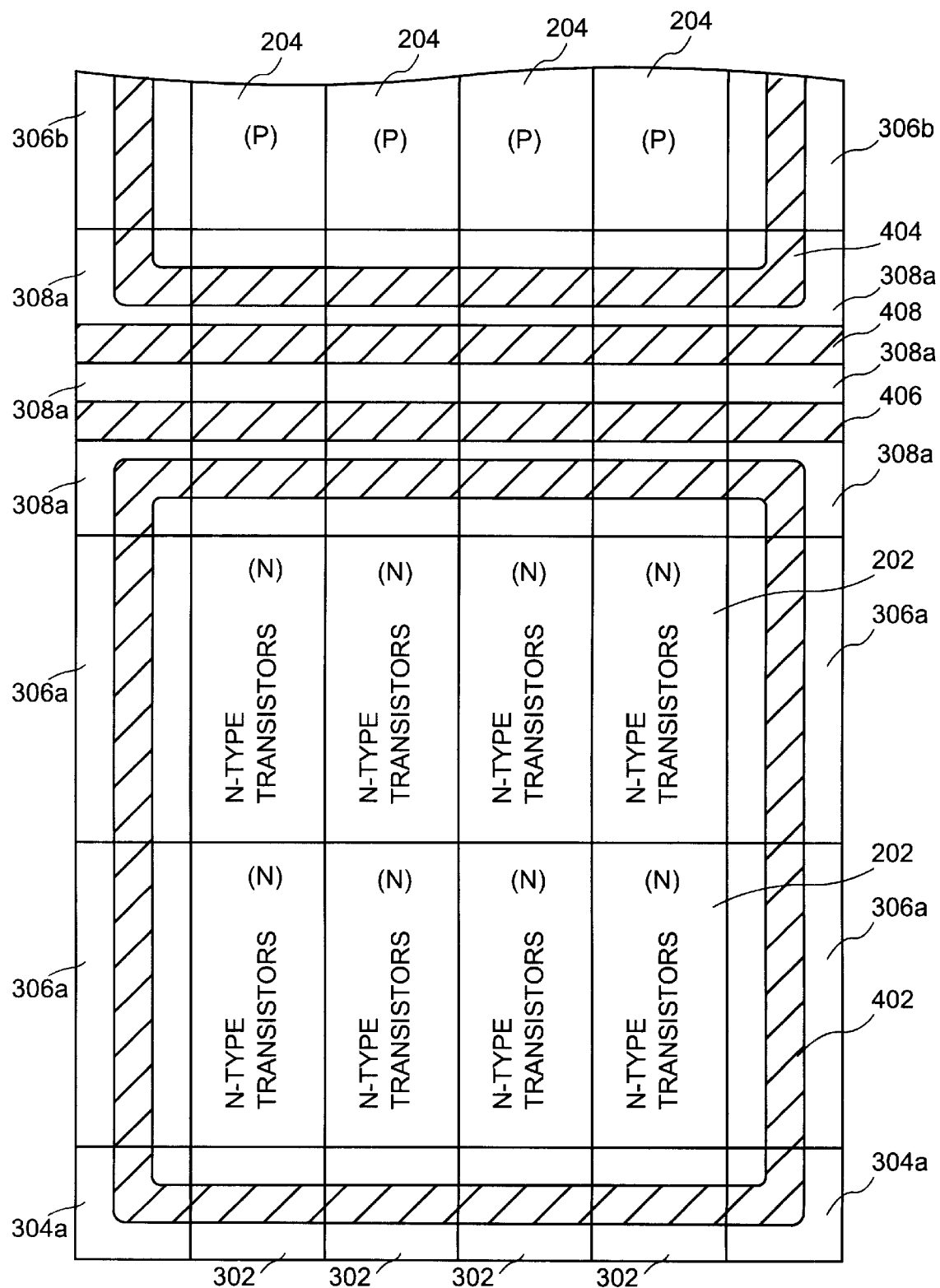
FIG. 4 illustrates a more detailed diagram of a portion of the generated I/O cell of FIG. 3, in accordance with one embodiment of the present invention.

FIG. 4 illustrates a more detailed diagram of a portion of the generated I/O cell 108' of FIG. 3, in accordance with one embodiment of the present invention. In this detailed diagram, the P-tap guard ring slices 306a, the P-tap guard ring corners 304a, the P-tap guard ring slices 302, and the ring slices 308 define a P-tap guard ring 402. The P-tap guard ring 402 will therefore provide good separation between adjacent generated I/O cells 108'. In addition, the P-tap guard ring 402 is also configured to assist in keeping an even substrate bias for the output transistors defined within the P-tap guard ring 402; In a like manner, the N-tap guard ring 404 that is defined within the ring slices 308, the N-tap guard ring slices 306b, and the N-tap guard ring corners 404b will ensure that the substrate bias is even around the transistors defined using the P-type transistors of the slices 204a. In addition, the P-tap guard ring 402, N-tap guard ring 404 as well as N-tap guard ring 406 and P-tap guard ring 408 are well configured to ensure that substrate noise is kept at a minimum for optimum latch up performance.

The ring slices 308 as well as the guard ring slices 308a also include N-tap guard ring strips 406, and P-tap guard ring strips 408. The N-tap guard ring strips 406 are provided to function as a collector for minority carriers in the substrate (i.e., electrons). The P-tap guard ring strips 408 are provided to function as a collector for majority carriers in the substrate (i.e., holes). Thus, the P-tap guard ring strips 408 and the N-tap guard ring strips 406 are configured to connect to adjacent generated I/O cells 138 ' and thus, complete a ring around the semiconductor chip that is defined in the periphery (i.e., in the I/O ring 104).

Figure 5:
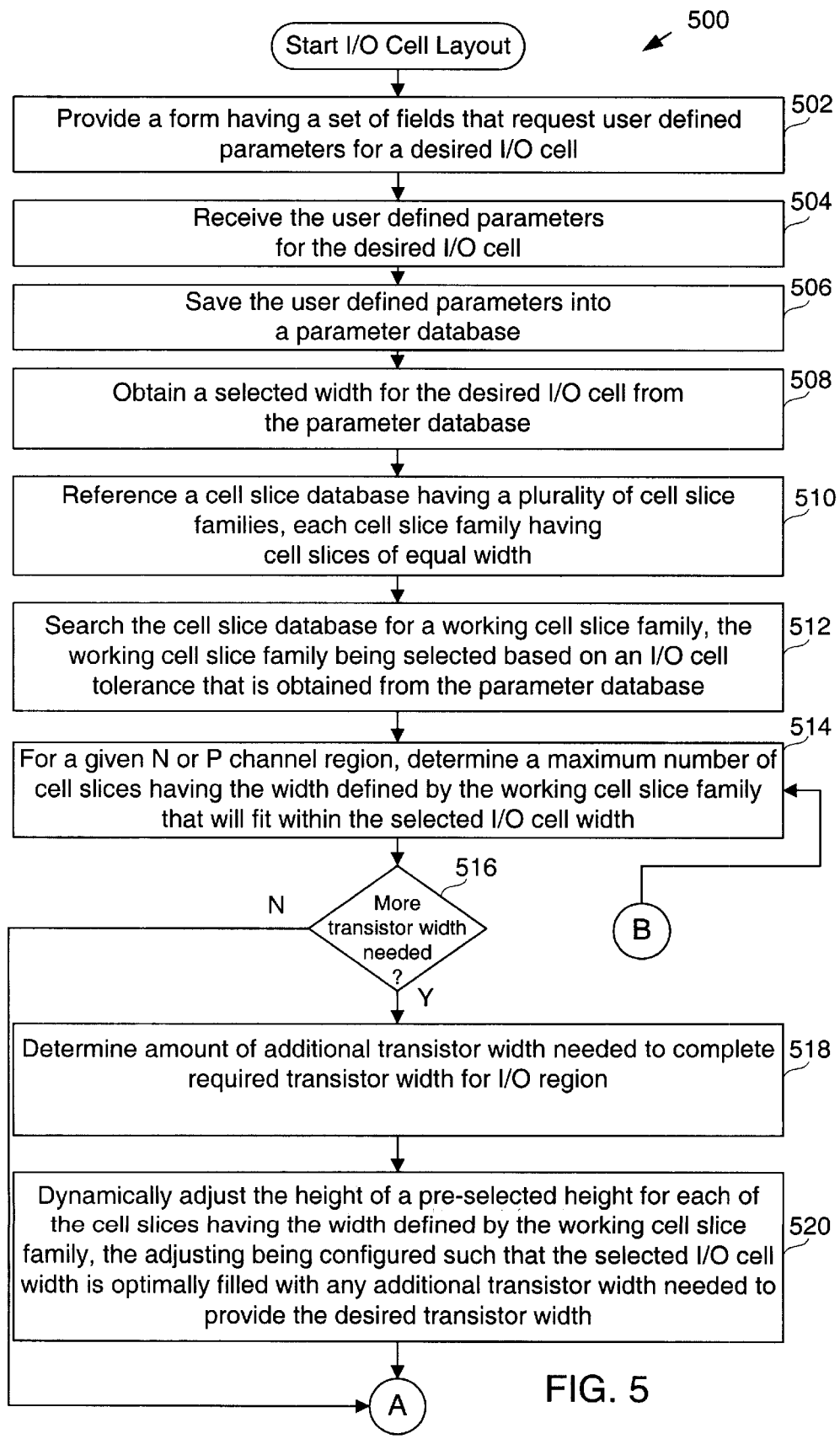
FIGS. 5–6 illustrate in one embodiment, a flowchart diagram for generating I/O cells for a layout.

FIG. 5 illustrates in one embodiment, a flowchart diagram for generating I/O cells for a layout. In this example, the method begins at an operation 502 where a form having a set of fields that requests user-defined parameters for a desired I/O cell is provided. In one embodiment, the form may have fields for the user to complete having parameters such as those in the selection table 150 of FIG. 1B. Typically, the user will be a layout design engineer or an integration engineer which is tasked with generating the I/O cells for a given semiconductor chip 100. The method then moves to operation 504 where the user-defined parameters are received for the desired I/O cell. The user-defined parameters are then saved into a parameter database in operation 506. The parameter database may be a temporary file, or data stored in memory for temporary use by the computer during the generation of the I/O cell. Therefore, the parameter database can be substituted for other techniques for holding data or storing data for temporary or longer term uses (e.g., for processing). The method now moves to operation 508 where, a selected width for the desired I/O cell is obtained from the parameter database.

As mentioned above, the parameter database will preferably include all of the parameters selected by the user including the selected cell width for the given design. In one embodiment, the cell width may be 50 microns, or, any other suitable width that is best suited to be integrated with the size of a given core region 202. At this point, the method moves to operation 510 where a cell slice database having a plurality of cell slice families is referenced. Each of the cell sliced families will have cell slices of equal width. Each cell slice in the cell slice family will thus have transistors laid out within the cell slice width. Now, the method moves to operation 512 where the cell slice database is searched for a working cell slice family. The working cell slice family is selected based on an I/O cell tolerance that is obtained from the parameter database (e.g., the tolerance was set by the user).

As defined herein, the I/O cell tolerance defines the gate stress capable of being withstood by a given transistor. In other words, the gates stress should not be more than the process voltage across any gate source or gate source junction. The method now moves to an operation 514 where for a given N or P-channel region, a maximum number of cell slices having the cell width defined by the working cell slice family that will fit within the selected I/O cell width, is determined. For instance, if the cell width was set by the user to not exceed a given number, then, the fixed cell slice width of the working cell slice family will only support a certain number of cell slices. Once the number of cell slices that can fit within the width are determined, the method moves to operation 516. In operation 516, it is determined whether more transistor width is needed. For example, if the drive strength required for a given I/O region has not yet been met by the number of cell slices defined along the width, additional cell slices will be required to provide the desired drive strength.

Figure 6:
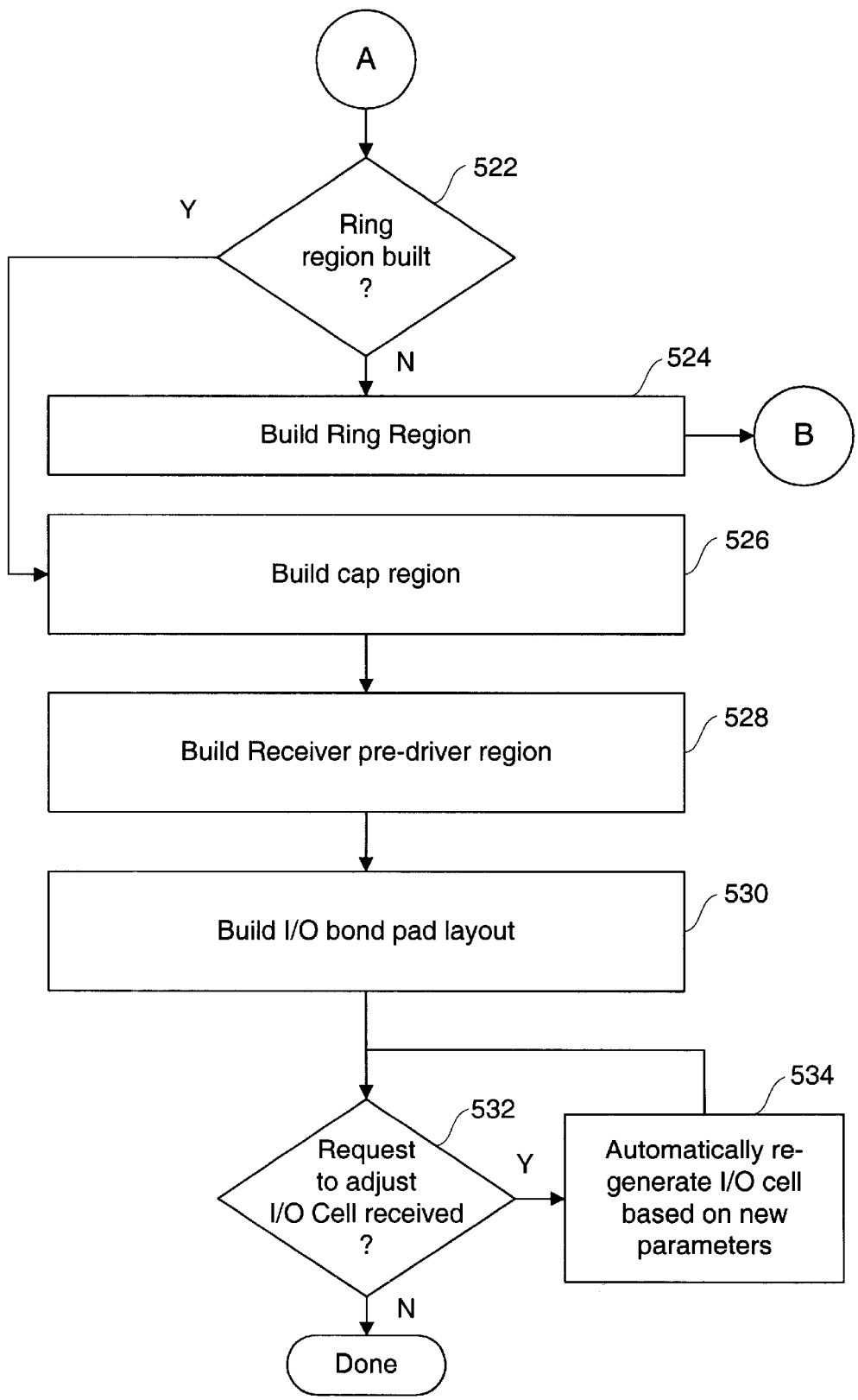

Thus, if more transistor width is needed, the method moves to operation 518. In operation 518, the amount of additional transistor width needed to complete the required transistor width for the I/O region is determined. As mentioned above, additional transistor width may be needed to provide the necessary drive strength for the given design. Now, the method moves to operation 520 where the height of a pre-selected height for each of the cell slices is dynamically adjusted. The adjusted cell slices will still remain with the same width defined by the working cell slice family. In this embodiment, the adjusting of the height is configured such that the selected I/O cell width is optimally filled with any additional transistor width needed to provide the desired transistor width. This is pictorially illustrated in FIGS. 2E and 2F above. If the initial layout of operation 514 did not result in the need for additional transistor width in operation 516, the method would move to A. The method resumes in FIG. 6 in which there is a determination as to whether a ring region has been built in operation 522. If a ring region has not been built, the method moves to operation 524 where the ring region is built. As defined above with reference to FIGS. 3 and 4, the ring region includes a plurality of ring slices 308 and guard ring slices 308a.

Once the ring region has been built in operation 524, the method moves to B and FIG. 5 in which operation 514 is repeated. Operation 514 may be, for example, repeated for generating the P-channel region of the I/O cell 108. As was the case for the N-channel region, a maximum number of cell slices having the cell width defined by the working cell slice family that will fit within the selected I/O cell width is determined. These cell slices are then filled in within the I/O cell width in a row orientation. If it is determined in operation 516 that more transistor width is needed, an additional row of transistors will be laid out above the first row of transistors. The second row of transistors may have to be adjusted in height if it is not necessary to provide the amount of transistor width that would be provided by a standard height transistor obtained from the cell slices of the given family. Once the P-channel region has been defined and laid out using the automated techniques, the method moves back to operation 522 of FIG. 6. At this point, it is determined in operation 522, that the ring region has already been built. Thus, the method will move to operation 526 where a cap region is built. The cap region is generally defined herein to include the P-tap guard ring slices 302, the P-tap guard ring corners 304a, the P-tap guard ring slices 306a, the N-tap guard ring slices 306b, the guard ring slices 308a, and the N-tap guard ring corners 304b (as shown in FIG. 4). The tap region therefore generally defines connections to the substrate (and that isolates the individual generated I/O cells 108') to ensure proper performance, in accordance with one embodiment of the present invention.

After the cap region has been built in operation 526, the method moves to operation 528 where a receiver pre-driver region is built. As shown with reference to FIG. 3, the receiver pre-driver region is shown as receiver pre-driver slice 310. Once the receiver pre-driver region has been built, the method moves to operation 530 where the I/O cell bond pad layout is completed. It is at this point that the user can stop and place the assembled I/O cells around the chip using their preferred method. The method now moves to operation 532 where it is determined if a request to adjust the I/O cell is received. In general, the software will have completed the generation of the I/O cells and will thus be ready to make modifications (e.g., if the I/O cell design is not to the designer's liking). In such a case, the designer can simply modify a parameter provided to the generation software and the I/O cells are automatically regenerated based upon the new parameters provided in operation 534. The method will then be complete once the user has approved the I/O cell layout. Of course, if additional modifications to the parameters are desired, the generation software can simply make those modifications and process the method in accordance with the present invention and generate a new layout having the desired performance and physical characteristics.

Figure 7:
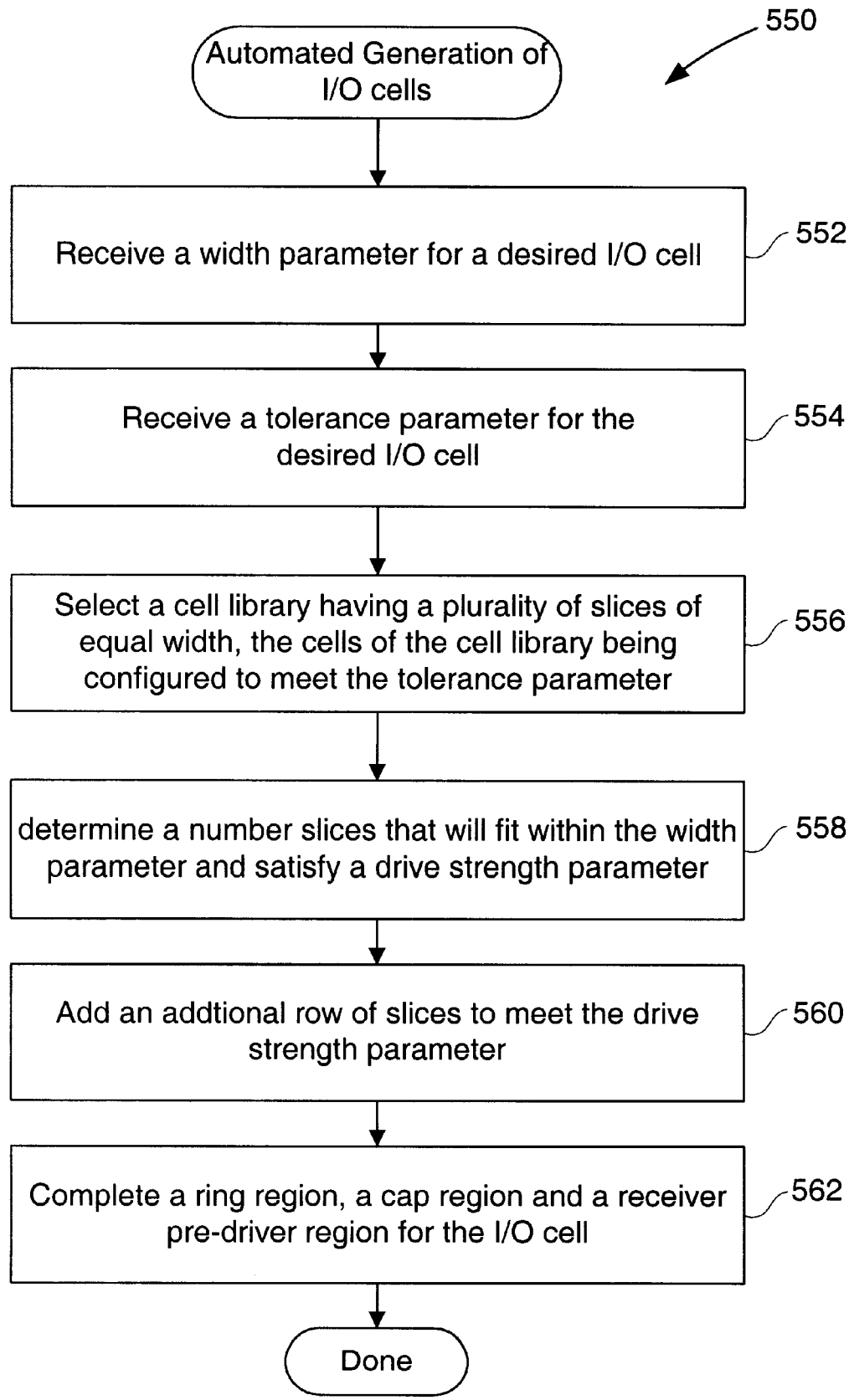
FIG. 7 shows a flowchart diagram defining method operations performed in the automated generation of I/O cells, in accordance with another embodiment of the present invention.

FIG. 7 shows a flowchart diagram 550 defining the method operations performed in the automated generation of I/O cells, in accordance with another embodiment of the present invention. The method begins at an operation 552 where a width parameter for a desired I/O cell is received. Once the width parameter for the desired I/O cell is received, a tolerance parameter for the desired I/O cell will be received in operation 554. These received parameters are provided by a design engineer or a designer who is in the process of designing an I/O cell having desired physical size characteristics and performance characteristics. The method now moves to operation 556 where a cell library having a plurality of slices of equal width is selected. The cells of the cell library are configured to meet specific tolerance parameters.

As mentioned above, the tolerance parameter is designed to determine whether the transistors of the cell library family will meet the particular gate stresses for the particular design. Once the cell library has been selected which meets the tolerance parameter, the method moves to operation 558 where a number of slices that will fit within the width parameter is determined. The number of slices should also satisfy a drive strength parameter. The drive strength parameter is also provided by the design engineer who requires a particular drive strength to be implemented for driving out of the semiconductor chip. If it is determined that additional drive strength is required for a particular design, an additional row of slices are added to meet the drive strength parameter in operation 560. This is an optional operation if the drive strength parameter has been met with the number of slices that fit within the width parameter and the standard height parameter of the slices from the cell library.

Now the method moves to operation 562 where a ring region, a cap region, and a receiver pre-driver region are completed for the I/O cell. As mentioned above with reference to FIGS. 3 and 4, the ring region provides isolation between the P-channel devices and the N-channel devices (the ring region is also configured to provide latch-up protection), the cap region provides isolation for the P-channel and the N-channel devices so that the substrate bias remains even around the output transistors.

Figure 8:
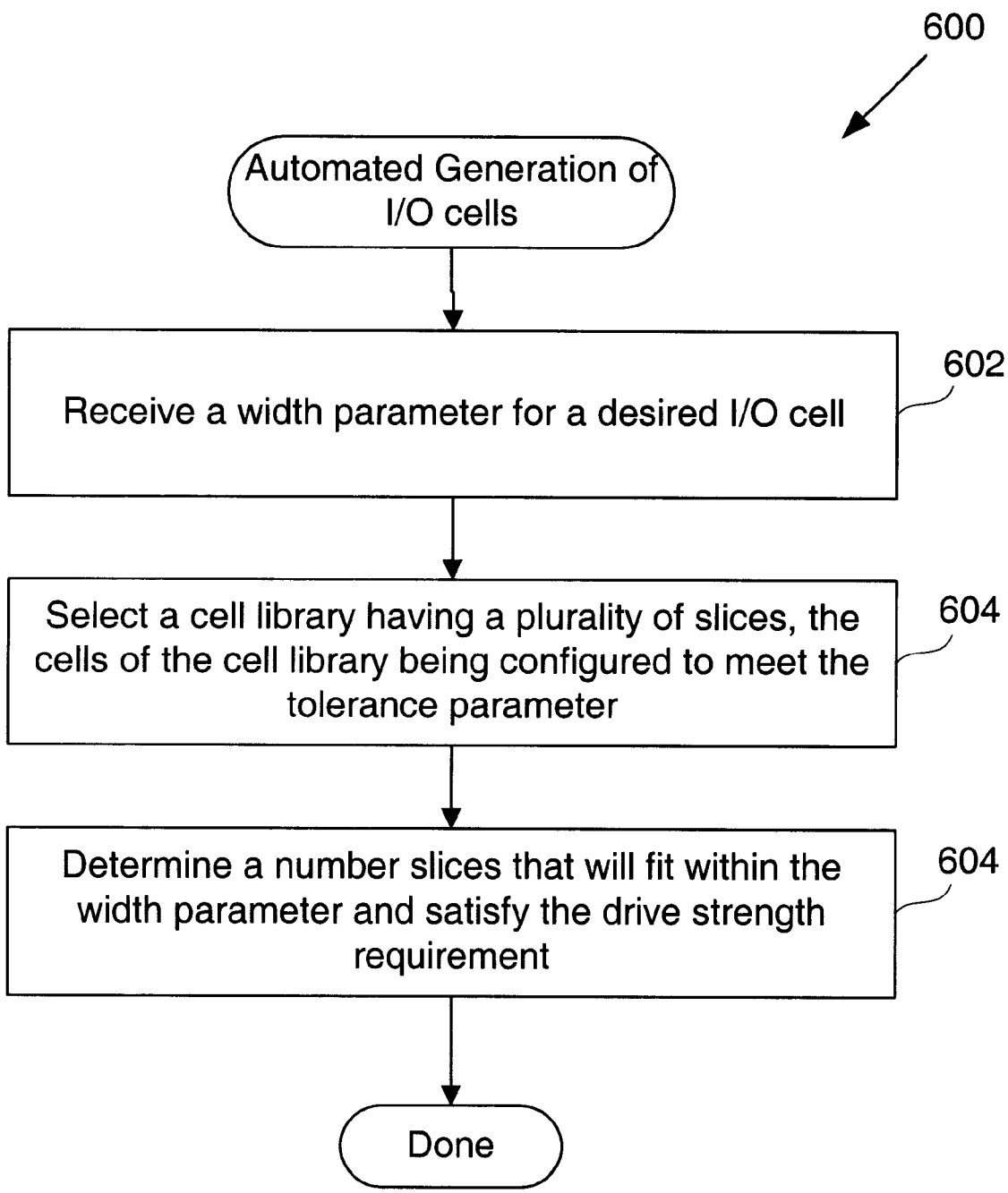
FIG. 8 is flowchart defining another method for generating I/O cells.

FIG. 8 shows a flowchart diagram 600 defining the method operations performed in the automated generation of I/O cells, in accordance with another embodiment of the present invention. The method begins at an operation 602 where a width parameter for a desired I/O cell is received. Once the width parameter for the desired I/O cell is received, the method moves to operation 604 where a cell library having a plurality of slices is selected. The cells of the cell library are configured to meet the tolerance parameter. Now, the method moves to operation 606 where a number of slices that will fit within the width parameter and satisfy the drive strength requirement. The number of slices should also satisfy a drive strength parameter. The drive strength parameter is also provided by the design engineer who requires a particular drive strength to be implemented for interfacing outside the semiconductor chip. At this point, housekeeping slices are added to the generated I/O cell. As mentioned above, these slices can include a ring region, a cap region, and a receiver pre-driver region.

As can be appreciated, the design of I/O cells for a given integrated circuit chip requires a number of variables which complicate the design process tremendously. However, by implementing the automated -methods of the present invention, the number of variables which can produce up to about 9,000 combinations of I/O cell designs per pad pitch, are intelligently handled to generate the desired I/O cell for meeting the design requirements. As such, the automated generation techniques eliminate the need to design thousands upon thousands of pre-designed I/O cells for a given library. In practice, circuit designers that provide libraries of integrated circuits can now provide a generation tool (i.e., a software generation tool) that the customer of the library design company can use to generate its specific I/O cell design.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, CD-Rs, CD-RWs, magnetic tapes, and other optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An automated method for generating input/output (I/O) cells for an integrated circuit chip, comprising:
   receiving a width parameter for a desired I/O cell to be used for the integrated circuit chip;
   receiving a tolerance parameter for the desired I/O cell;
   selecting a cell library having a plurality of slices, the cell library being selected to meet the tolerance parameter;
   determining a number of the plurality of slices to be used to fit within the width parameter and to satisfy a drive strength parameter; and
   filling the I/O cell within the width parameter with a first row of the determined number of the plurality of slices.

2. An automated method for generating input/output (I/O) cells for an integrated circuit chip as recited in claim 1, further comprising:
   determining if the drive strength parameter is satisfied with the determined number of the plurality of slices; and
   if the drive strength parameter is not satisfied, the method further includes,
      determining an amount of additional transistor width needed to satisfy the drive strength parameter;
      adjusting a height parameter of each of the plurality of slices so as to fill a second row of height adjusted slices within the width parameter; and
   filling the second row using the adjusted height parameter of each of the plurality of slices, the second row being defined adjacent to the first row.

3. An automated method for generating input/output (I/O) cells for an integrated circuit chip as recited in claim 1, further comprising:
   determining whether a ring region has been built for the desired I/O cell;
   if the ring region has not been built, the method further includes,
      building a ring region, the ring region being defined over the first row of the determined number of the plurality of slices, the first row defining an N-type region of the desired I/O cell.

4. An automated method for generating input/output (I/O) cells for an integrated circuit chip as recited in claim 3, further comprising:
   filling the I/O cell within the width parameter with a second row of the determined number of the plurality of slices, the second row defining a P-type region of the desired I/O cell.

5. An automated method for generating input/output (I/O) cells for an integrated circuit chip as recited in claim 4, further comprising:
   building a receiver pre-driver region over the second row.

6. An automated method for generating input/output (I/O) cells for an integrated circuit chip as recited in claim 5, further comprising:
   applying a P-tap guard ring around the N-type region; and
   applying an N-tap guard ring around the P-type region.

7. An automated method for generating input/output (I/O) cells for an integrated circuit chip as recited in claim 3, wherein the ring region includes a P-tap guard ring segment and an N-tap guard ring segment.

8. An automated method for generating input/output (I/O) cells for an integrated circuit chip as recited in claim 4, further comprising:
   determining if the drive strength parameter is satisfied with the determined number of the plurality of slices; and
   if the drive strength parameter is not satisfied, the method further includes,
      determining an amount of additional transistor width needed to satisfy the drive strength parameter;
      adjusting a height parameter of each of the plurality of slices so as to fill another row of height adjusted slices within the width parameter; and
   filling another row using the adjusted height parameter of each of the plurality of slices, the another row being defined adjacent to the second row.

9. An automated method for generating input/output (I/O) cells for an integrated circuit chip as recited in claim 1, wherein generating the number of the plurality of slices to be used to fit within the width parameter of the desired I/O cell further includes factoring of one or more of:

a pad pitch parameter;

a tolerance parameter;

an input level parameter;

an input buffer style parameter;

a slew rate parameter;

a ring voltage parameter;

a core voltage;

a parameter for of one of an in-line pad arrangement and a staggered pad arrangement; and a bond pad top layer metal parameter.

10. An automated method for generating input/output (I/O) cells for an integrated circuit chip, comprising:

receiving a width parameter for a desired I/O cell to be used for the integrated circuit chip;

receiving a tolerance parameter for the desired I/O cell;

selecting a cell library having a plurality of slices, the cell library being selected to meet the tolerance parameter;

determining a number of the plurality of slices to be used to fit within the width parameter and to satisfy a drive strength parameter; and filling the I/O cell within the width parameter with a first row of the determined number of the plurality of slices, wherein the plurality of slices of the cell library include N-type transistor slices, P-type transistor slices, cap slices, and receiver pre-driver slices.

11. A computer implemented method for automatically generating a custom I/O cell for an I/O region of a semiconductor chip, the I/O ring being defined around a core region of the semiconductor chip, the computer implemented method comprising:

providing a selection form requesting user input of a desired I/O cell width and performance characteristics;

receiving user input;

selecting a cell slice width for cell slices to be obtained from a cell slice library;

determining a transistor width requirement to meet the performance requirements;

determining a height for the custom I/O cell, the height being selected so as to meet the transistor width requirement while maintaining the desired I/O cell width; and filling the desired I/O cell width with one or more of the cell slices having the determined height, the custom I/O cell being configured to at least meet the performance requirements.

12. A computer implemented method for automatically generating a custom I/O cell for an I/O region of a semiconductor chip as recited in claim 1, wherein the selection form includes selection of one or more of:

a pad pitch parameter;

a drive strength parameter;

a tolerance parameter;

an input level parameter;

an input buffer style parameter;

a slew rate parameter;

a ring voltage parameter;

a parameter for of one of an in-line pad arrangement and a staggered pad arrangement; and a bond pad top layer metal parameter.

13. A computer implemented method for automatically generating a custom I/O cell for an I/O region of a semiconductor chip, the I/O ring being defined around a core region of the semiconductor chip, the computer implemented method comprising:

providing a selection form requesting user input of a desired I/O cell width and performance characteristics;

receiving user input;

selecting a cell slice width for cell slices to be obtained from a cell slice library;

determining a transistor width requirement to meet the performance requirements;

determining a height for the custom I/O cell, the height being selected so as to meet the transistor width requirement while maintaining the desired I/O cell width;

filling the desired I/O cell width with one or more of the cell slices having the determined height, the custom I/O cell being configured to at least meet the performance requirements; and wherein the cell slice library includes cell slices for at least N-type transistor slices, P-type transistor slices, ring slices, and cap slices, and receiver slices.

14. A computer implemented method for automatically generating a custom I/O cell for an I/O region of a semiconductor chip as recited in claim 13, wherein at least one or more of the N-type transistor slices and P-type transistor slices that are generated for the custom I/O cell are designed to implement electrostatic discharge (ESD) protection.

15. A computer implemented method for automatically generating a custom I/O cell for an I/O region of a semiconductor chip as recited in claim 13, wherein at least one or more of the N-type transistor slices and P-type transistor slices that are generated for the custom I/O cell are designed to implement an output driver and an input, resistance.

16. A computer implemented method for automatically generating a custom I/O cell for an I/O region of a semiconductor chip as recited in claim 13, wherein the cap slices are configured to implement p-tap guard rings and n-tap guard rings, the p-tap guard rings being used to isolate an N-type transistor region of the custom I/O cell and the n-tap guard rings being used to isolate a P-type transistor region of the custom I/0 cell.

17. A computer implemented method for automatically generating a custom I/O cell for an I/O region of a semiconductor chip as recited in claim 13, wherein the ring slices include a p-tap guard ring strip and an n-tap guard ring strip.

18. A computer implemented method for automatically generating a custom I/O cell for an I/O region of a semiconductor chip as recited in claim 17, wherein the guard rings include some of devices required to achieve a proper voltage tolerance level.

19. A computer implemented method for automatically generating a custom I/O cell for an I/O region of a semiconductor chip, the I/O ring being defined around a core region of the semiconductor chip, the computer implemented method comprising:

providing a selection form requesting user input of a desired I/O cell width and performance characteristics;

receiving user input;

selecting a cell slice width for cell slices to be obtained from a cell slice library;

determining a transistor width requirement to meet the performance requirements;

determining a height for the custom I/O cell, the height being selected so as to meet the transistor width requirement while maintaining the desired I/O cell width;

filling the desired I/O cell width with one or more of the cell slices having the determined height, the custom I/O cell being configured to at least meet the performance requirements; and distributing a plurality of the custom I/O cells around the I/O region, the distributing of the custom I/O cells including the layout of associated bond pads to interface with each of the plurality of the custom I/O cells.

20. A method for generating an I/O cell and an associated bond pad, the I/O cell and the bond pad designed to be replicated around a core region of an integrated circuit chip, the method comprising:

receiving a pad pitch parameter;

receiving user defined performance characteristics, the performance characteristics including,
a drive strength parameter;

receiving a selection of one of an in-line pad arrangement and a staggered pad arrangement; and generating an I/O cell having an I/O cell width and a configured height, the configured height being defined to meet the performance characteristics.

21. A method for generating an I/O cell and an associated bond pad, the I/O cell and the bond pad designed to be replicated around a core region of an integrated circuit chip, the method comprising:

receiving a pad pitch parameter;

receiving user defined performance characteristics, the performance characteristics including,
a drive strength parameter;

receiving a selection of one of an in-line pad arrangement and a staggered pad arrangement;

generating an I/O cell having an I/O cell width and a configured height, the configured height being defined to meet the performance characteristics; and wherein the performance characteristics further include,
a tolerance parameter;
an input level parameter;
an input buffer style parameter;
a slew rate parameter;
a ring voltage parameter; and
a bond pad top layer metal parameter.

22. A computer readable media containing program instructions for generating input/output (I/O) cells for an integrated circuit chip, the computer readable media comprising:

program instructions for receiving a width parameter for a desired I/O cell to be used for the integrated circuit chip;

program instructions for receiving a tolerance parameter for the desired I/O cell;

program instructions for selecting a cell library having a plurality of slices, the selection being configured to select cells meeting the tolerance parameter;

program instructions for determining a number of the plurality of slices to be used to fit within the width parameter and to satisfy a drive strength parameter; and program instructions for filling the I/O cell within the width parameter with a first row of the determined number of the plurality of slices.

23. A computer readable media containing program instructions for generating input/output (I/O) cells for an integrated circuit chip as recited in claim 22, further comprising:

program instructions for determining if the drive strength parameter is satisfied with the determined number of the plurality of slices, and if the drive strength parameter is not satisfied, the method further includes,
program instructions for determining an amount of additional transistor width needed to satisfy the drive strength parameter;
program instructions for adjusting a height parameter of each of the plurality of slices so as to fill a second row of height adjusted slices within the width parameter; and program instructions for filling the second row using the adjusted height parameter of each of the plurality of slices, the second row being defined adjacent to the first row.

24. A computer implemented method for automatically generating a custom I/O cell for an I/O region of a semiconductor chip, the I/O ring being defined around a core region of the semiconductor chip, the computer implemented method comprising:

selecting a cell slice width for cell slices to be obtained from a cell slice library;

determining a transistor width requirement to meet a tolerance parameter;

determining a height for the custom I/O cell, the height being selected so as to meet the tolerance parameter while maintaining the desired I/O cell width; and filling the desired I/O cell width with one or more of the cell slices having the determined height, the custom I/O cell being configured to at least meet the tolerance parameter.

25. A computer implemented method for automatically generating a custom I/O cell for an I/O region of a semiconductor chip, the computer implemented method comprising:

receiving a width parameter for the custom I/O cell;

selecting a cell library having a plurality of slices, the slices of the selected cell library being configured to meet a tolerance parameter;

determining a number of slices that will fit within the width parameter and that satisfy a desired drive strength requirement.

* * * * *